(12) United States Patent
Tong et al.

(10) Patent No.: US 7,741,909 B2
(45) Date of Patent: Jun. 22, 2010

(54) LINEAR-IN-DB VARIABLE GAIN AMPLIFIER

(75) Inventors: Yan Tong, Singapore (SG); Ying-Tang Chang, Taipei County (TW)

(73) Assignee: Mediatek Singapore Pte Ltd, Ayer Rajah Crescent (SG)

( * ) Notice: Subject to any disclaimer, the term of this patent is extended or adjusted under 35 U.S.C. 154(b) by 54 days.

(21) Appl. No.: 12/102,082

(22) Filed: Apr. 14, 2008

(65) Prior Publication Data

US 2009/0256635 A1   Oct. 15, 2009

(51) Int. Cl.
    *H03F 3/45* (2006.01)
(52) U.S. Cl. .................................................. 330/254
(58) Field of Classification Search ............... 330/254; 327/346, 347, 359
    See application file for complete search history.

(56) References Cited

U.S. PATENT DOCUMENTS

| | | | |
|---|---|---|---|
| 5,570,056 A * | 10/1996 | Groe | 327/359 |
| 5,880,631 A * | 3/1999 | Sahota | 330/51 |
| 5,886,579 A | 3/1999 | Mangelsdorf | |
| 6,583,667 B1 | 6/2003 | Dasgupta et al. | |
| 6,777,999 B2 * | 8/2004 | Kanou et al. | 327/346 |
| 6,791,413 B2 | 9/2004 | Komurasaki et al. | |
| 2005/0195035 A1 | 9/2005 | Hu | |
| 2007/0072569 A1 | 3/2007 | McCarthy et al. | |

OTHER PUBLICATIONS

"An All CMOS 84dB-Linear Low-Power Variable Gain Amplifier" Duong et al.; 2005 Symposium on VLSI Circuits Digest of Technical Papers; pp. 114-117.

* cited by examiner

*Primary Examiner*—Robert Pascal
*Assistant Examiner*—Khiem D Nguyen
(74) *Attorney, Agent, or Firm*—Thomas, Kayden, Horstemeyer & Risley (57) ABSTRACT

A variable gain amplifier (VGA) with a gain thereof exponential to a control voltage thereof. The variable gain amplifier (VGA) comprises an exponential DC converter, and a linear voltage multiplier. The exponential DC converter receives the control voltage and generates an exponential voltage which is exponential to the control voltage. The linear voltage multiplier is coupled to the exponential DC converter and has a gain proportional to the exponential voltage of the exponential DC converter.

13 Claims, 7 Drawing Sheets

LINEAR-IN-DB VARIABLE GAIN AMPLIFIER

BACKGROUND OF THE INVENTION

1. Field of the Invention

The invention relates to a variable gain amplifier and, in particular, to a linear-in-dB variable gain amplifier.

2. Description of the Related Art

Figure 1:
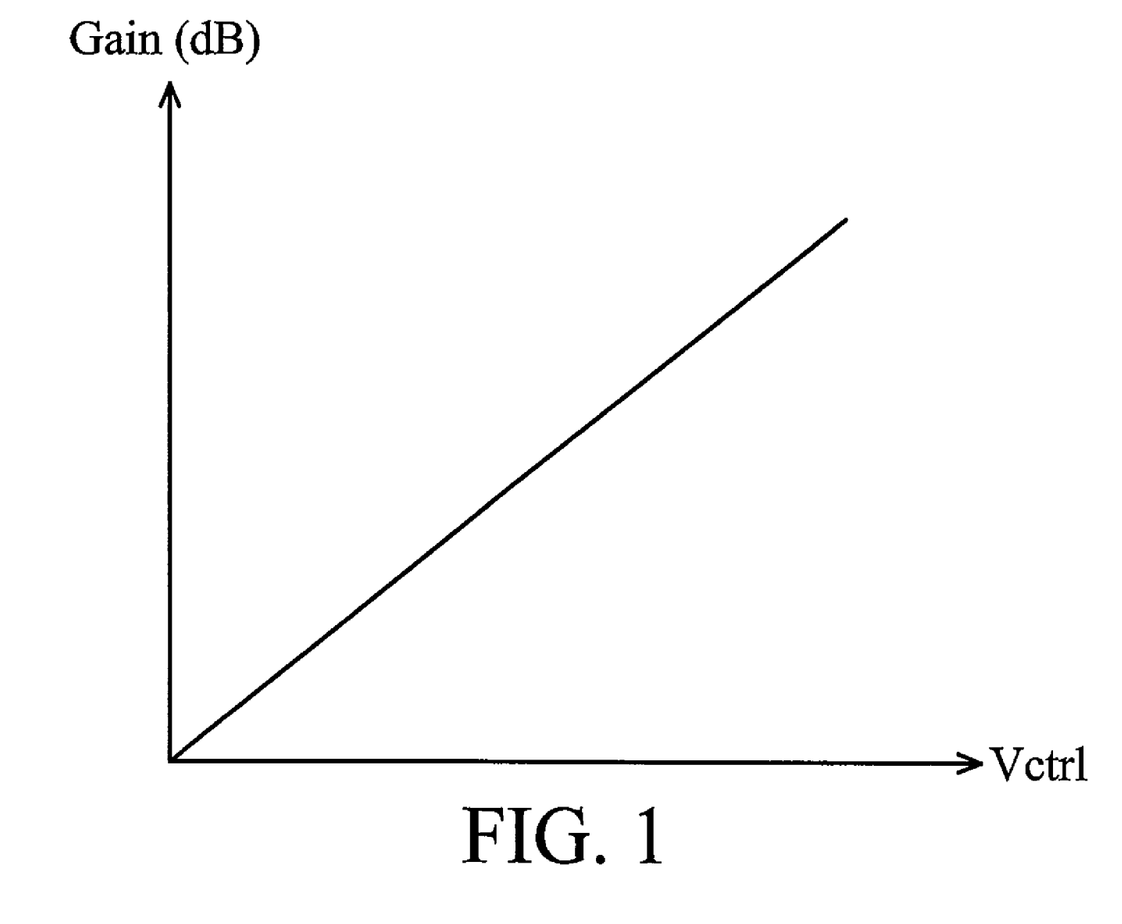
FIG. 1 is a characteristic diagram of a linear-in-dB variable gain amplifier (VGA)

FIG. 1 is a characteristic diagram of a linear-in-dB variable gain amplifier (VGA). In FIG. 1, a vertical axis represents a gain of the linear-in-dB VGA in dB, and a horizontal axis represents a control voltage of the linear-in-dB VGA in Volt. The gain of the linear-in-dB VGA can be expressed as Gain=$f$(Vctrl)=$A_0 \cdot \exp(K \cdot \text{Vctrl})$. Typical applications of the linear-in-dB VGA are automatic gain control (AGC) and power control in wireless transceivers, automatic gain control (AGC) in hard disk read channel ICs, and analog adaptive filter/equalizer used in high speed cable/optical receivers, partial-response most-likelihood (PRML) read channel ICs and pulse based ultra wide band (UWB) receivers.

Since the current to voltage relationship of a bipolar device is exponential, it is not difficult to design a linear-in-dB VGA using a bipolar process. However, current of an MOS device is a square function of a bias voltage thereof. As a result, it is difficult to design a linear-in-dB VGA using a CMOS process.

BRIEF SUMMARY OF THE INVENTION

An embodiment of a variable gain amplifier (VGA) with a gain thereof exponential to a control voltage thereof comprises an exponential DC converter, and a linear voltage multiplier. The exponential DC converter receives the control voltage and generates an exponential voltage which is exponential to the control voltage. The linear voltage multiplier is coupled to the exponential DC converter and has a gain proportional to the exponential voltage of the exponential DC converter.

The invention provides architecture of a linear-in-dB VGA. With the architecture, the linear-in-dB VGA is easily constructed using a CMOS process.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
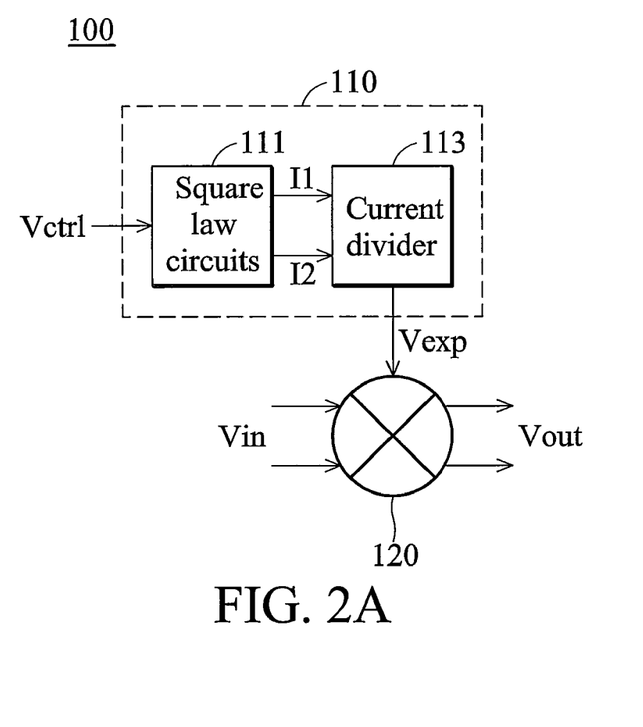
FIG. 2A is a block diagram of a linear-in-dB variable gain amplifier (VGA) according to an embodiment of the invention.

FIG. 2A is a block diagram of a linear-in-dB variable gain amplifier (VGA) according to an embodiment of the invention. The linear-in-dB variable gain amplifier (VGA) 100 has a gain exponential to a control voltage Vctrl thereof and comprises an exponential DC converter 110, and a linear voltage multiplier 120. The exponential DC converter 110 receives the control voltage Vctrl and generates an exponential voltage Vexp which is exponential to the control voltage Vctrl. The linear voltage multiplier 120 is coupled to the exponential DC converter 110 and has a gain proportional to the exponential voltage Vexp of the exponential DC converter 110. The gain of the linear voltage multiplier 120 equals the gain of the linear-in-dB variable gain amplifier (VGA) 100. More specifically, the linear voltage multiplier 120 may be a Gilbert-type or current-steering type voltage multiplier.

Figure 2B:
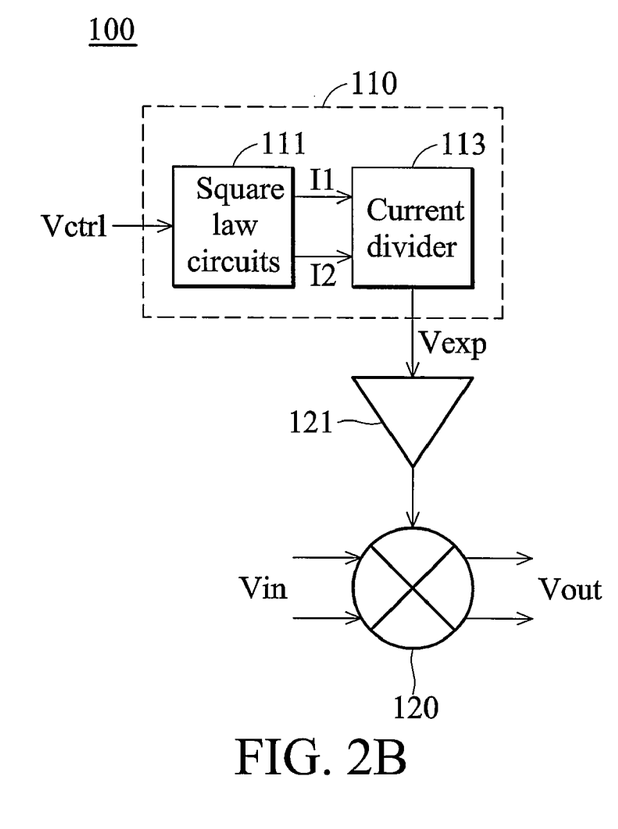
FIGS. 2B, 2C and 2D are block diagrams of variants of the linear-in-dB variable gain amplifier (VGA) in FIG. 2A.
Figure 2C:
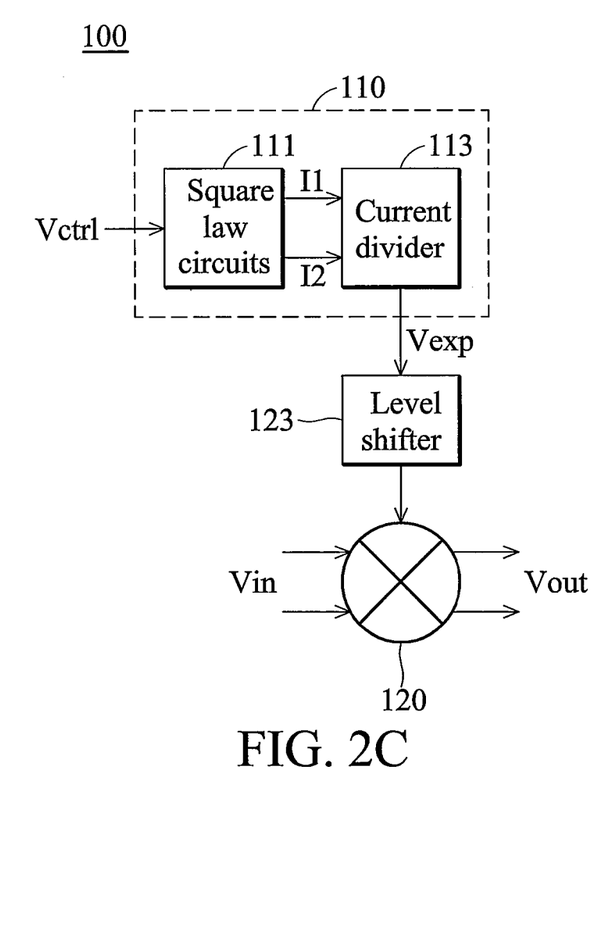
Figure 2D:
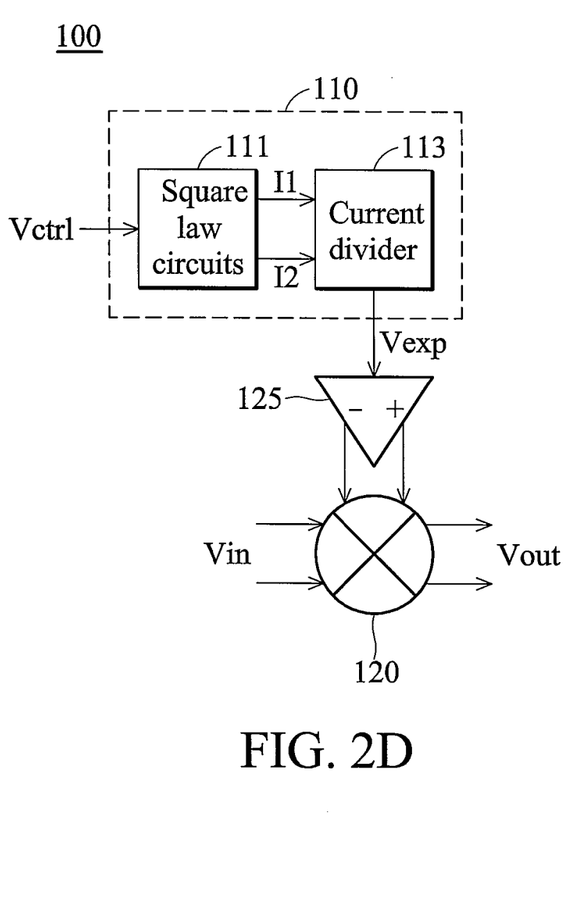

In FIG. 2A, the exponential DC converter 110 comprises a square law circuit 111 and a current divider 113. The square law circuit 111 receives the control voltage Vctrl and generates a first current I1 and a second current I2. The current divider 113 receives the first and second currents I1 and I2 and generates the exponential voltage Vexp. A current ratio I1/I2 between the first and second currents I1 and I2 is exponential to the control voltage Vctrl. In addition, the exponential voltage Vexp is proportional to the current ratio I1/I2 of the first and second currents I1 and I2. Moreover, a voltage buffer 121, a level shifter 123 or a single-ended to differential converter 125 is coupled between the exponential DC converter 110 and the linear voltage multiplier 120, respectively as shown in FIGS. 2B, 2C and 2D.

Figure 3A:
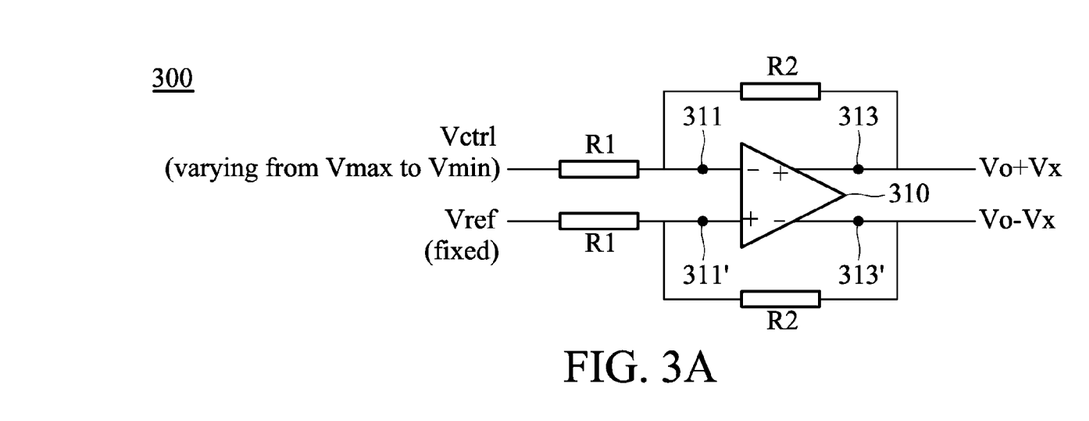
FIG. 3A is a schematic diagram of a differential control voltage generator of the square law circuit according to an embodiment of the invention.
Figure 3B:
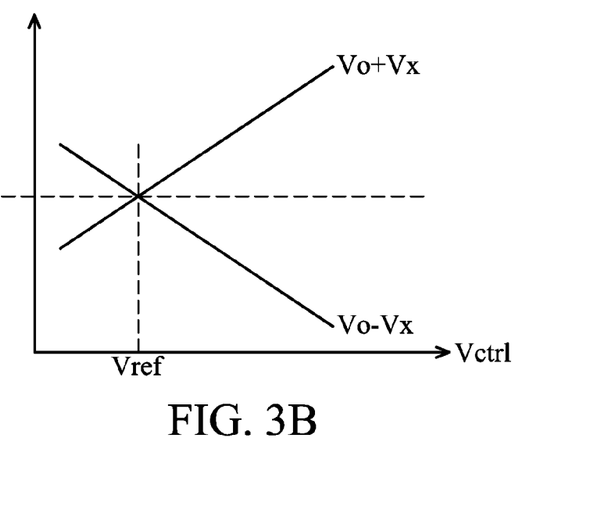
FIG. 3B is a characteristic diagram of the differential control voltage generator 300.

More specifically, the square law circuit 111 comprises a differential control voltage generator and a differential circuit coupled to the differential control voltage generator. FIG. 3A is a schematic diagram of a differential control voltage generator of the square law circuit according to an embodiment of the invention. The differential control voltage generator 300 comprises a differential amplifier 310 and resistor pairs R1 and R2. An inverting input 311 and a non-inverting input 311' of the differential amplifier 310 respectively receive the control voltage Vctrl and a reference voltage Vref via the resistors R1. The inverting input 311 and the non-inverting input 311' of the differential amplifier 310 are respectively coupled to a non-inverting output 313 and an inverting output 313' via the resistors R2. The differential control voltage generator 300 generates differential control voltages Vo+Vx and Vo-Vx at the non-inverting output 313 and the inverting output 313' of the differential amplifier 310, respectively. FIG. 3B is a characteristic diagram of the differential control voltage generator 300. A vertical axis represents voltage level of the differential control voltages Vo+Vx and Vo-Vx and a horizontal axis represents voltage level of the control voltage Vctrl. In FIG. 3B, when the control voltage Vctrl equals the reference voltage Vref, the differential control voltages both equal Vo.

Figure 3C:
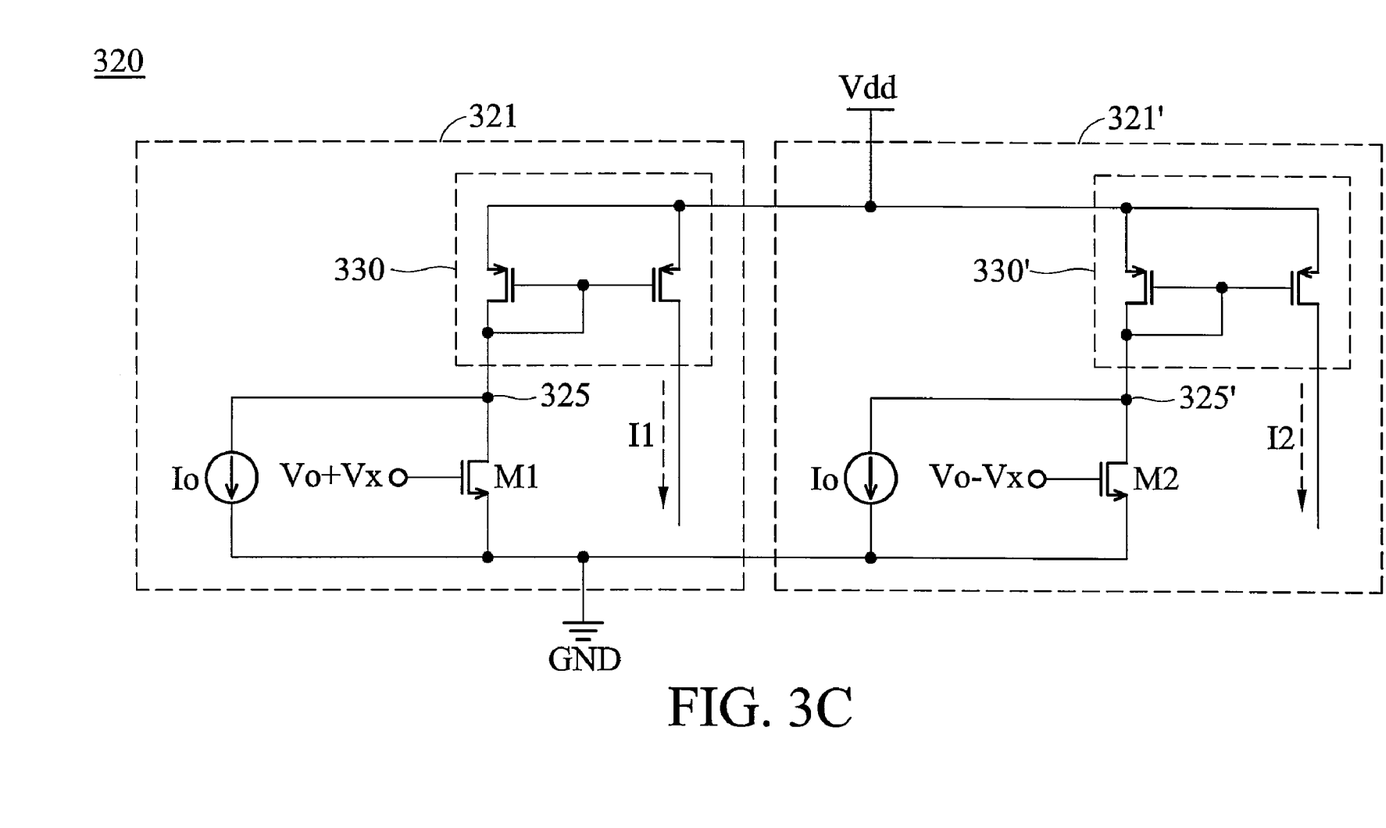
FIG. 3C is a schematic diagram of a differential circuit of the square law circuit according to an embodiment of the invention.

FIG. 3C is a schematic diagram of a differential circuit of the square law circuit according to an embodiment of the invention. The differential circuit 320 is coupled between a supply voltage Vdd and a ground GND. Each half circuit 321/321' of the differential circuit 320 comprises an NMOS transistor M1/M2, a current mirror 330/330', and a current source Io. In each half circuit 321/321', the current mirror 330/330' is coupled to a drain 325/325' of the NMOS transistor M1/M2. In addition, the current source is also coupled to the drain 325/325' of the NMOS transistor M1/M2. As a result, the current mirror 330/330' generates an output current $I_1/I_2$ according to the NMOS current $I_{M1}/I_{M2}$ and the current from the current source Io. The NMOS currents $I_{M1}$ and $I_{M2}$ are respectively expressed as $$I_{M1} = \frac{1}{2}K(Vo + Vx - V_{th})^2$$

and $$I_{M2} = \frac{1}{2}K(Vo - Vx - V_{th})^2,$$

wherein $$K = \mu_n C_{ox}\left(\frac{W}{L}\right)_{1,2}.$$

As a result, a ratio between the output currents $I_1$ and $I_2$ can be expressed as $$\frac{I_1}{I_2} = \frac{I_{M1} + I_o}{I_{M2} + I_o} = \frac{k + (1 + aVx)^2}{k + (1 - aVx)^2} \approx \exp(2aVx),$$

wherein $$k = \frac{2I}{K(Vo - Vth)^2}$$

and $$a = \frac{1}{Vo - Vth}.$$

Figure 4A:
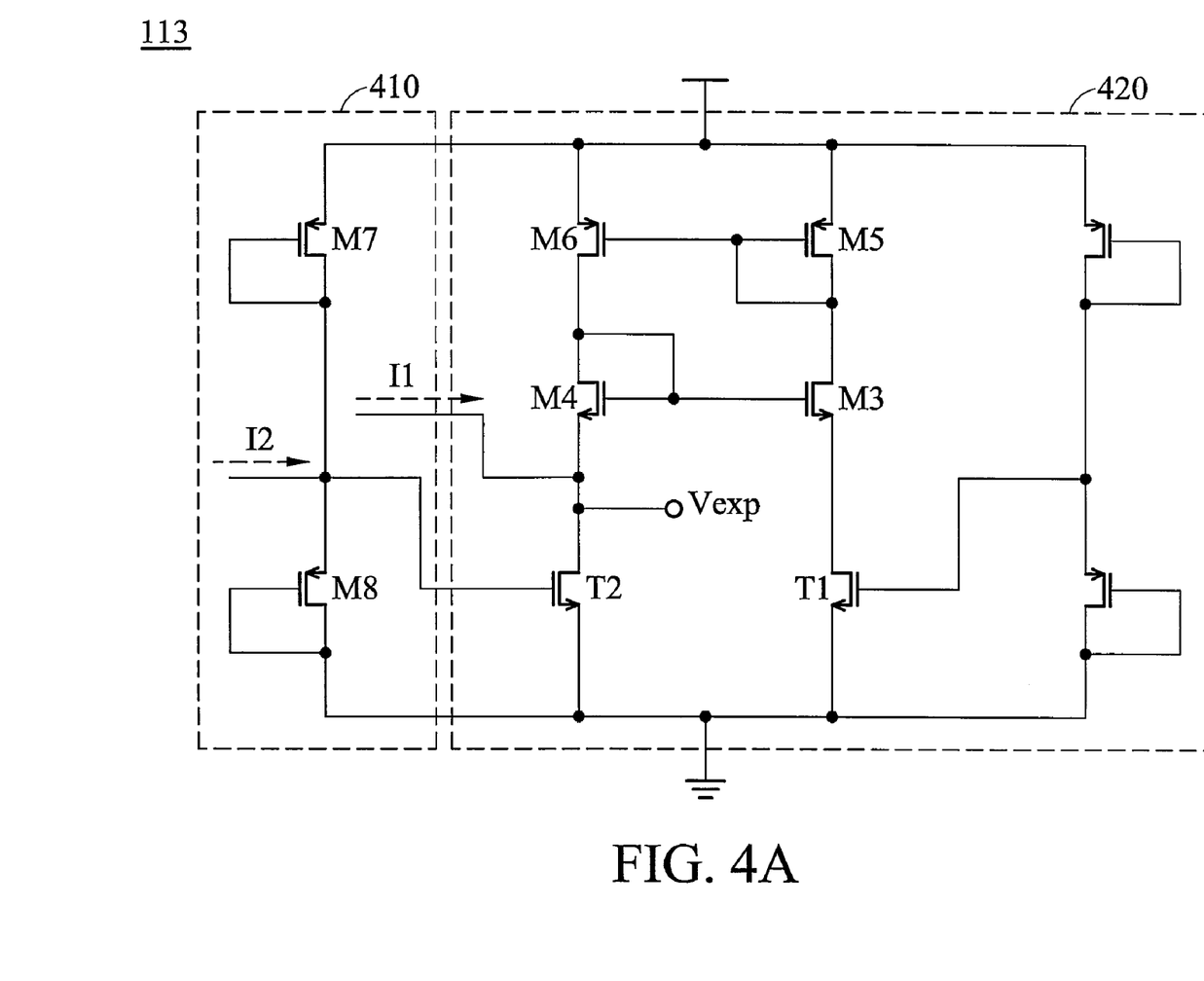
FIG. 4A is a schematic diagram of a current divider according to an embodiment of the invention.
Figure 4B:
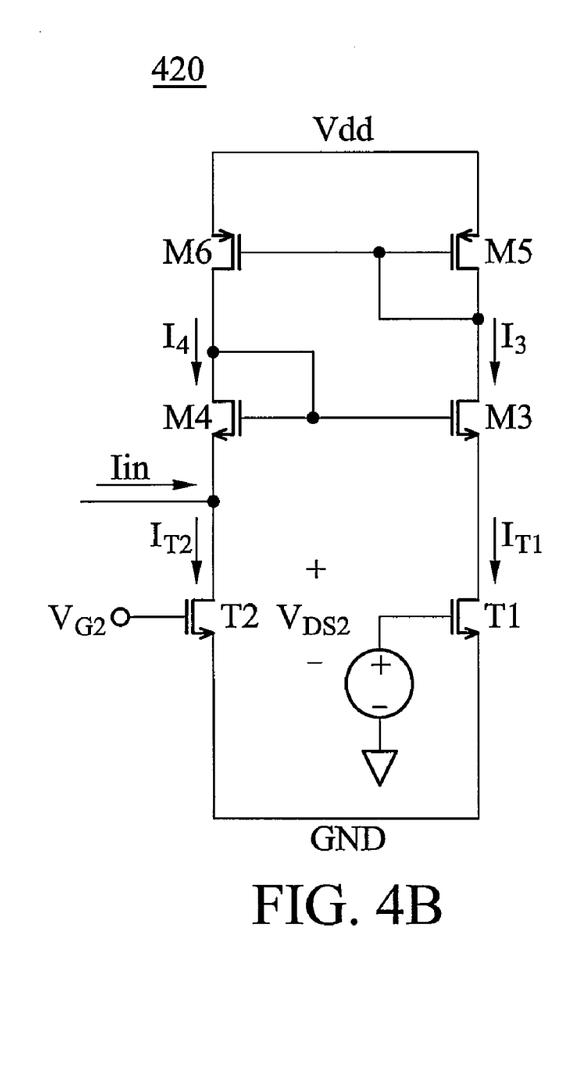
FIG. 4B is a circuit diagram of the voltage controlled resistor 420 in FIG. 4A.

More specifically, the current divider 113 comprises a current to voltage converter 410 and a voltage controlled resistor 420 coupled to and controlled by the current to voltage converter 410, as shown in FIG. 4A. FIG. 4B is a circuit diagram of the voltage controlled resistor 420 in FIG. 4A. In FIG. 4B, NMOS transistors T2 and M4 and a PMOS transistor M6 are cascoded between a supply voltage Vdd and a ground GND. In addition, NMOS transistors T1 and M3 and a PMOS transistor are also cascoded between the supply voltage and the ground GND. The NMOS transistor M4 and the PMOS transistor M5 are diode-connected. Gates of the PMOS transistors M5 and M6 are connected and those of the NMOS transistors M3 and M4 are also connected. The PMOS transistors M5 and M6 are operated in saturation mode and a current mirror ratio thereof is 1. The NMOS transistors M3 and M4 are also operated in saturation mode to keep Vgs4=Vgs3 such that Vs4=Vs3, resulting in Vds2=Vds1. The NMOS transistors T1 and T2 are operated in a triode region. As a result, the currents of the NMOS transistors T1 and T2 are respectively expressed as $$I_{T1} = \frac{K_{n1}}{2}(2(V_{G1} - V_{GND} - V_{Tn1})V_{DS1} - V_{DS1}^2)$$

and $$I_{T2} = I_{in} + I_4 = \frac{K_{n2}}{2}(2(V_{G2} - V_{GND} - V_{Tn2})V_{DS2} - V_{DS2}^2).$$

From the previous current equations, it is known that $I_{in} = K_n \cdot (V_{G2} - V_{G1}) \cdot V_{DS2}$.

Figure 4C:
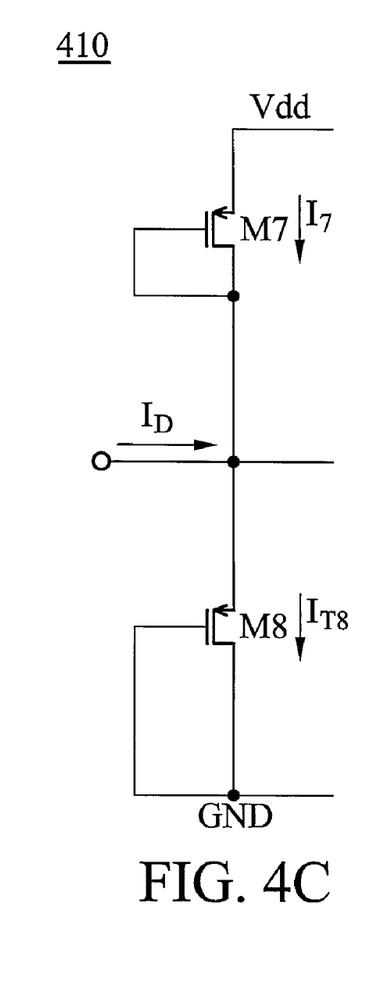
FIG. 4C is a circuit diagram of the current to voltage converter 410 in FIG. 4A.

FIG. 4C is a circuit diagram of the current to voltage converter 410 in FIG. 4A. The current to voltage converter 410 comprises PMOS transistors M7 and M8 cascoded between the supply voltage $V_{DD}$ and the ground. The PMOS transistors M7 and M8 are identical, matched, and diode connected. In addition, the PMOS transistor M8 is gate-grounded. If Vds8 is denoted as $$\frac{V_{DD}}{2} + V_Y,$$

the currents of the PMOS transistors M7 and M8 are respectively expressed as $$I_7 = \frac{1}{2}K(V_{GS7} - V_{th})^2 = \frac{1}{2}K\left(\frac{V_{DD}}{2} - V_Y - V_{th}\right)^2$$

and $$I_8 = \frac{1}{2}K(V_{GS8} - V_{th})^2 = \frac{1}{2}K\left(\frac{V_{DD}}{2} + V_Y - V_{th}\right)^2.$$

From the previous current equations of the PMOS transistors M7 and M8, it is known that $I_D = I_8 - I_7 = K \cdot (V_{DD} - 2V_{th}) \cdot V_Y$ and $$V_Y = \left(V_{DS8} - \frac{V_{DD}}{2}\right).$$

When the current converter 410 and the voltage controlled resistors are combined, a current divider is constructed as shown in FIG. 4A. In FIG. 4A, gate of the NMOS transistor T1 is connected between two diode-connected PMOS transistors such that gate voltage thereof equals $$\frac{V_{DD}}{2}.$$

In addition, gate of the NMOS transistor T2 is connected to a drain of the PMOS transistor M8. As a result, $$V_{DS2} = \frac{K_p(V_{DD} - 2V_{th})}{K_n} \cdot \frac{I_1}{I_2}$$

is obtained. In other words, $V_{DS2}$ is used as the exponential voltage which is proportional to the current ratio I1/I2.

The invention provides architecture of a linear-in-dB VGA. With the architecture, the linear-in-dB VGA is easily constructed using a CMOS process.

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. A variable gain amplifier (VGA) with a gain thereof exponential to a control voltage thereof, comprising:
    an exponential DC converter receiving the control voltage and generating an exponential voltage which is exponential to the control voltage, and comprising:
        a square law circuit receiving the control voltage and generating first and second currents; and
        a current divider receiving the first and second currents and generating the exponential voltage, wherein a current ratio between the first and second currents is exponential to the control voltage, and the exponential voltage is proportional to the current ratio of the first and second currents; and
    a linear voltage multiplier coupled to the exponential DC converter and having a gain proportional to the exponential voltage of the exponential DC converter.

2. The variable gain amplifier (VGA) as claimed in claim 1, further comprising a voltage buffer, a level shifter or a single-ended to differential converter coupled between the exponential DC converter and the linear voltage multiplier.

3. The variable gain amplifier (VGA) as claimed in claim 1, wherein the linear voltage multiplier is a Gilbert-type or current-steering type voltage multiplier.

4. The variable gain amplifier as claimed in claim 1, wherein the square law circuit comprises:
    a differential control voltage generator, generating a pair of differential control voltages according to the control voltage and a reference voltage; and
    a differential circuit coupled to the differential control voltage generator, generating the first and second currents according to the pair of differential control voltages.

5. The variable gain amplifier as claimed in claim 4, wherein the differential control voltages are mutually equal when the control voltage is equal to the reference voltage.

6. The variable gain amplifier as claimed in claim 1, wherein the current divider comprises:
    a current to voltage converter, generating a voltage corresponding to the second current; and
    a voltage controlled resistor coupled to the current to voltage converter, generating the exponential voltage according to the first current and the voltage corresponding to the second current.

7. A variable gain amplifier (VGA) with a gain thereof exponential to a control voltage thereof, comprising:
    an exponential DC converter, generating an exponential voltage according to a first current and a second current, wherein the exponential voltage is exponential to the control voltage, and a current ratio between the first and second currents is exponential to the control voltage, wherein the exponential DC converter comprises:
        a square law circuit, receiving the control voltage and generating the first and second currents; and
        a current divider coupled to the square law circuit, receiving the first and second currents and generating the exponential voltage; and
    a linear voltage multiplier coupled to the exponential DC converter, having the gain which is proportional to the exponential voltage of the exponential DC converter.

8. The variable gain amplifier as claimed in claim 7, further comprising a voltage buffer, a level shifter or a single-ended to differential converter coupled between the exponential DC converter and the linear voltage multiplier.

9. The variable gain amplifier as claimed in claim 7, wherein the linear voltage multiplier is a Gilbert-type or current-steering type voltage multiplier.

10. The variable gain amplifier as claimed in claim 7, wherein the exponential voltage is proportional to the current ratio of the first and second currents.

11. The variable gain amplifier as claimed in claim 7, wherein the square law circuit comprises:
    a differential control voltage generator, generating a pair of differential control voltages according to the control voltage and a reference voltage; and
    a differential circuit coupled to the differential control voltage generator, generating the first and second currents according to the pair of differential control voltages.

12. The variable gain amplifier as claimed in claim 11, wherein the differential control voltages are mutually equal when the control voltage is equal to the reference voltage.

13. The variable gain amplifier as claimed in claim 7, wherein the current divider comprises:
    a current to voltage converter, generating a voltage corresponding to the second current; and
    a voltage controlled resistor coupled to the current to voltage converter, generating the exponential voltage according to the first current and the voltage corresponding to the second current.

* * * * *